(12) United States Patent
Campbell et al.

(10) Patent No.: US 9,281,213 B2
(45) Date of Patent: Mar. 8, 2016

(54) HIGH PRECISION CAPACITOR DIELECTRIC (71) Applicant: Texas Instruments Incorporated, Dallas, TX (US)

(72) Inventors: John Paul Campbell, Dallas, TX (US); Kaiping Liu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/576,736

(22) Filed: Dec. 19, 2014

(65) Prior Publication Data

US 2015/0187598 A1 Jul. 2, 2015

Related U.S. Application Data (60) Provisional application No. 61/921,598, filed on Dec. 30, 2013.

(51) Int. Cl.
H01L 21/28 (2006.01)
H01L 21/321 (2006.01)
H01L 49/02 (2006.01)
H01L 21/285 (2006.01)
H01L 21/3213 (2006.01)

(52) U.S. Cl.
CPC .......... *H01L 21/3211* (2013.01); *H01L 21/285* (2013.01); *H01L 21/28035* (2013.01); *H01L 21/28518* (2013.01); *H01L 21/28525* (2013.01); *H01L 21/32139* (2013.01); *H01L 28/60* (2013.01)

(58) Field of Classification Search
CPC ................ H01L 21/3211; H01L 21/60; H01L 21/28525; H01L 21/28035; H01L 21/32139; H01L 21/28518
See application file for complete search history.

(56) References Cited

U.S. PATENT DOCUMENTS 7,160,800 B2 * 1/2007 Wu et al. ........................ 438/642

* cited by examiner

*Primary Examiner* — Savitr Mulpuri
(74) *Attorney, Agent, or Firm* — Jacqueline J. Garner; Frank D. Cimino (57) ABSTRACT A process of forming an integrated circuit forms a high precision capacitor bottom plate with a metallic surface and performs a plasma treatment of the metallic surface. A high precision capacitor dielectric is formed by depositing a first layer of the capacitor dielectric on the high precision capacitor bottom plate wherein the first layer is silicon nitride, depositing a second layer of the capacitor dielectric on the first layer wherein the second portion is silicon dioxide, and depositing a third layer of the capacitor dielectric on the second portion wherein the third layer is silicon nitride. Plasma treatments may also be performed on the layers of capacitor dielectric pre- and/or post-deposition. A metallic high precision capacitor top plate is formed on the high precision capacitor dielectric.

13 Claims, 12 Drawing Sheets

HIGH PRECISION CAPACITOR DIELECTRIC

CROSS-REFERENCE TO RELATED APPLICATIONS

This application claims the benefit of priority under U.S.C. §119(e) of U.S. Provisional Application 61/921,598, the contents of which are hereby incorporated by reference.

FIELD OF INVENTION

This invention relates to the field of integrated circuits. More particularly, this invention relates to methods of building high precision capacitors in integrated circuits.

BACKGROUND

Analog integrated circuits (IC's) such as analog-to-digital (A2D) and digital-to-analog (D2A) converters, for example, often require high precision capacitors to perform the analog to digital conversions. Some of the capacitor requirements for a true eighteen bit converter IC, for example, are a ratio stability of less than 0.00075% over 10 years, a voltage coefficient of less than 10 ppm per volt, a temperature drift match of less than 0.05% per degree Celsius, dielectric absorption of less than 0.00075% and capacitance greater than 0.5 fF per square micrometer, among other things.

Such integrated circuit capacitors are generally formed during the IC fabrication process whereby a thin dielectric layer is established between two conductive plates. A crucial limitation in manufacturing high precision integrated circuit capacitors is the formation of the capacitor dielectric. Because dielectrics composed of a single layer of dielectric material such as silicon dioxide or silicon nitride have unacceptably large voltage coefficients or dielectric adsorption, composite dielectric stacks of dielectrics with offsetting dielectric properties such as oxide/nitride/oxide dielectric stacks have been introduced to provide capacitor dielectrics with lower voltage coefficients and with acceptable dielectric absorption.

The voltage dependent capacitance, C(V), is given by the equation $$C(V)=1+\beta V+\alpha V^2$$

Where V is the voltage, $\beta$ is the linear voltage coefficient of capacitance and $\alpha$ is the quadratic voltage coefficient of capacitance. Whereas $\beta$ may be compensated by circuitry, $\alpha$ cannot. It is therefore desirable to form capacitor dielectrics with a low $\alpha$ in IC's that require high precision capacitors for such operations as A2D and D2A conversions.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A process of forming an integrated circuit forms a high precision capacitor bottom plate with a metallic surface and performs a plasma treatment of the metallic surface. A high precision capacitor dielectric is formed by depositing a first layer of the capacitor dielectric on the high precision capacitor bottom plate wherein the first layer is silicon nitride, depositing a second layer of the capacitor dielectric on the first layer wherein the second portion is silicon dioxide, and depositing a third layer of the capacitor dielectric on the second portion wherein the third layer is silicon nitride. Plasma treatments may also be performed on the layers of capacitor dielectric pre- and/or post-deposition. A metallic high precision capacitor top plate is formed on the high precision capacitor dielectric.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The number of digits that can be converted from an analog to digital converter (A2D precision) is limited by the nonlinear behavior of the high precision capacitors used for the conversion. Embodiment plasma treatment of the surface of the bottom capacitor plate prior to dielectric deposition and plasma treatment pre and post deposition of the dielectric layers in a high precision capacitor significantly reduces the nonlinear behavior thus improving the precision of the A2D converter.

Figure 1:
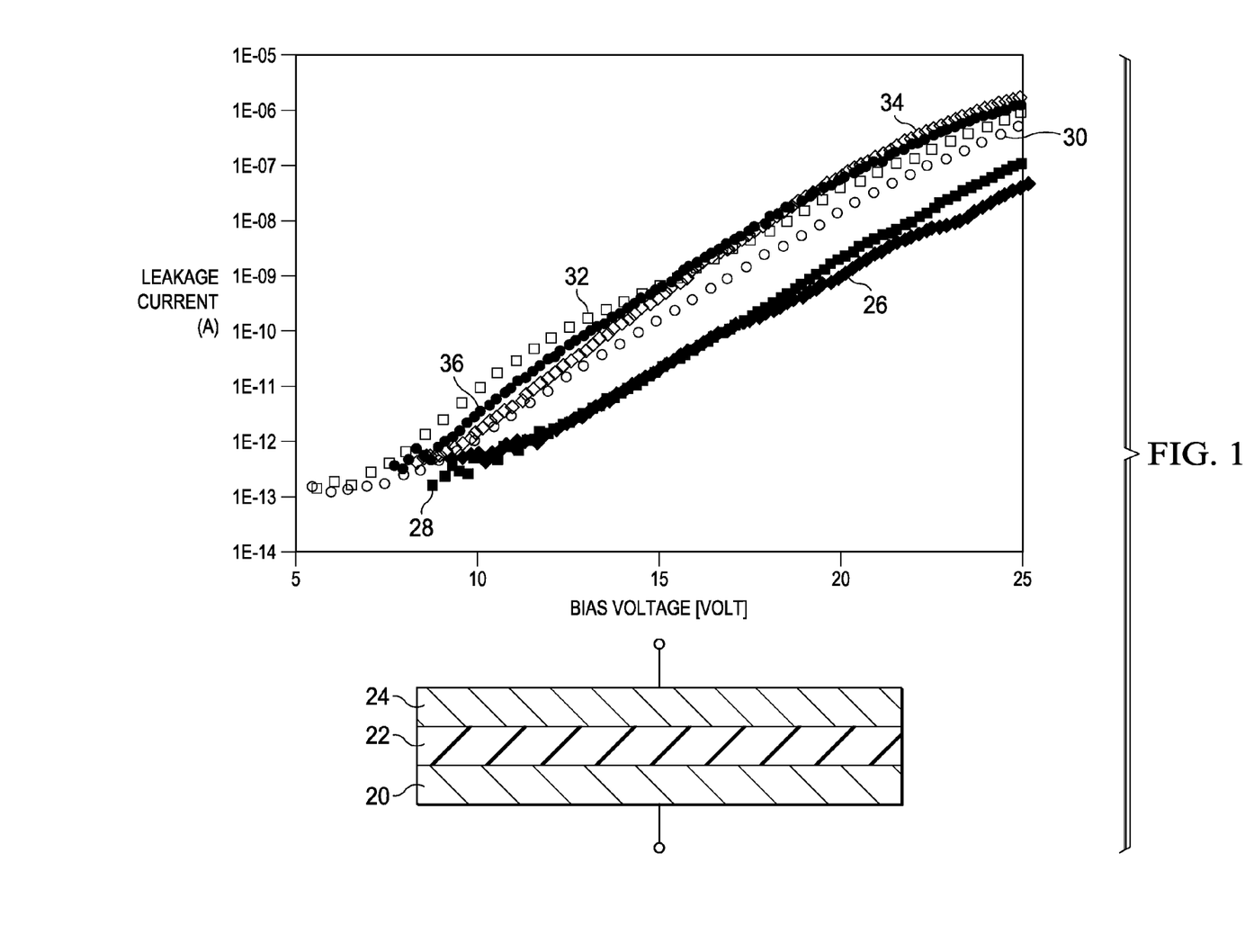
FIG. 1 is a comparison graph of the leakage current of capacitors which are fabricated according to principles of the invention with capacitors which were not fabricated according to principles of the invention.

An example capacitor is shown in FIG. 1. The capacitor has a bottom capacitor plate 20, a capacitor dielectric 22, and a top capacitor plate 24. Electrical characteristics of four different capacitors labeled A, B, C, and D with four different dielectrics 22 are listed in TABLE 1.

TABLE 1

| | Dielectric | capacitance (fF/um²) | Breakdown in Volts @ 0.1 nA/um² | β Linear capacitance coefficient (ppm/V) | α Quadratic capacitance coefficient (ppm/V²) |
|---|---|---|---|---|---|
| A | 43 nm Nitride with no plasma treatment | 1.39 | 29.4 | −6.9 | 7.59 |
| B | 37 nm Nitride with plasma treatment | 1.6 | 26.5 | −0.86 | 4.21 |
| C | 12.5/10/12.5 NON with no plasma treatment | 1.46 | 32.3 | 13.14 | 7.06 |
| D | 10/10/10 nm NON plasma treatment | 1.59 | 30.6 | −10.37 | 1.45 |

The dielectric in capacitor A in Table 1 is 43 nm silicon nitride with no embodiment pre deposition or post deposition plasma treatment whereas the dielectric in capacitor B is 37 nm silicon nitride with an embodiment pre deposition and post deposition plasma treatments. As shown in TABLE 1, the embodiment pre and post plasma treatments reduce the quadratic capacitance voltage coefficient, α, by almost half. The quadratic capacitance voltage coefficient, α, is reduced from about 7.6 ppm/V² for capacitor A to about 4.2 ppm/V² for capacitor B resulting in a significant reduction in nonlinear capacitance variation. This results in a significant improvement in the precision of operations that require high precision capacitors such as analog to digital conversion.

Graphs of leakage current vs. voltage for the dielectrics in capacitors A and B are shown in FIG. 1. Leakage current curve 30 is for capacitor A when the bias voltage is applied to the top capacitor plate 24 and the bottom capacitor plate 20 is grounded. Leakage current curve 32 is for capacitor A when the bias voltage is applied to the bottom capacitor plate 20 and the top capacitor plate 24 is grounded. Capacitor A has significant asymmetry in the leakage current depending upon which capacitor plate is biased. Asymmetry in the capacitor leakage current may have a deleterious effect to the integrated circuit performance. For example, if the capacitor leakage current is asymmetric, then when an identical voltage is applied to the top plate of a first of two identical capacitors and to the bottom plate of the second identical capacitor, the two voltages may be different due to differences in leakage current. This may result in a logic error or in undesirable distortion in an output signal from a D2A or A2D converter.

Leakage current curve 34 is for capacitor B when the bias voltage is applied to the top capacitor plate 24 and the bottom capacitor plate 20 is grounded. Leakage current curve 36 is for capacitor B when the bias voltage is applied to the bottom capacitor plate 20 and the top capacitor plate 24 is grounded. Curves 34 and 36 lay approximately one on top of the other showing that the leakage current is symmetric and is independent of which capacitor plate (20 or 24) is biased. The embodiment pre and post deposition plasma treatment of the capacitor dielectric reduces the asymmetry of the leakage current.

The quadratic voltage coefficient of capacitance, α, may also be improved by forming a composite capacitor dielectric. Capacitors C and D in Table 1 have composite dielectrics formed of two silicon nitride (N) layers with a silicon dioxide layer (O) sandwiched in between (NON).

The α of capacitor C which has a composite NON dielectric comprised of 12.5 nm N/10 nm O/12.5 nm N is lower than the α of capacitor A which has a 43 nm silicon nitride (N) dielectric. Neither the dielectric in capacitor C nor A were manufactured with embodiment pre and post deposition insitu plasma treatments.

Capacitor D in Table 1 is composed of 10 nm/10 nm/10 nm NON with an embodiment capacitor plate plasma treatment and with embodiment pre dielectric deposition plasma treatments and with embodiment post dielectric deposition plasma treatments of the NON dielectric layers. As seen in Table 1 the α of capacitor D with the embodiment capacitor plate plasma pretreatment and with the embodiment dielectric pre and post deposition plasma treatments is approximately 5 times smaller than capacitor C which lacks the capacitor plate and dielectric embodiment plasma treatments. The α of the composite NON dielectric in capacitor D is approximately 3 times smaller than the single film N dielectric in capacitor B which also had the embodiment pre deposition plasma treatment. The embodiment capacitor plate treatment and the embodiment pre and post dielectric deposition plasma treatments significantly improve the α of high precision capacitors. This results in a significant reduction in capacitor variation due to voltage and in a significant improvement in the precision of operations such as those employing high precision capacitors in integrated circuits with A2D and D2A convertors.

Leakage current curve 26 in FIG. 1 is for capacitor D when the bias voltage is applied to the top capacitor plate 24 and the bottom capacitor plate 20 is grounded. Leakage current curve 28 is for capacitor D when the bias voltage is applied to the bottom capacitor plate 20 and the top capacitor plate 24 is grounded. Curves 26 and 28 lay approximately one on top of the other showing that the leakage current is symmetric regardless of which capacitor plate, 20 or 24, is biased.

The embodiment pre and post dielectric deposition plasma treatments may be applied before or after each dielectric layer (nitride or oxide) is deposited. The embodiment pre and post dielectric deposition plasma treatments may also be applied both before and after each dielectric layer (nitride or oxide) is deposited.

A capacitor bottom plate plasma treatment process (before the first dielectric layer) may be added to remove poor quality native oxide dielectric from the surface prior to the capacitor dielectric deposition. A native oxide of about 1 nm or less may form on the metallic capacitor bottom plate. The metallic capacitor bottom plate may be a metallic layer such as a silicided polysilicon layer such as titanium silicide, cobalt silicide, or nickel silicide formed at the same time as the transistor gates are formed in the integrated circuit or the metallic capacitor bottom plate may be a metal bottom plate such as titanium nitride, tantalum nitride, or titanium/tungsten (TiW) formed within the interconnection layers in an integrated circuit. Native oxide which typically forms on the metallic surface of the capacitor bottom plate is a poor quality dielectric that degrades the capacitor electrical parameters such as α. An embodiment plasma treatment of the metallic bottom plate may be performed in an ammonia plus nitrogen ambient to remove the poor quality native oxide. In an example, an embodiment capacitor bottom plate plasma treatment is performed at a temperature between about 350° C. to 450° C. for about 5 to 30 sec in a high frequency power (HFRF) between 250 and 800 watts, and a pressure in the range of about 1.5 Torr to 2.5 Torr. For the embodiment electrode pretreatment used to manufacture capacitor D in Table 1, the temperature is about 400° C., HFRF is about 600 watts, gas flow is about 3850 sccm NH3 plus about 2800 sccm $N_2$, pressure is about 2.2 Torr, and time is about 12 sec.

Figure 2A:
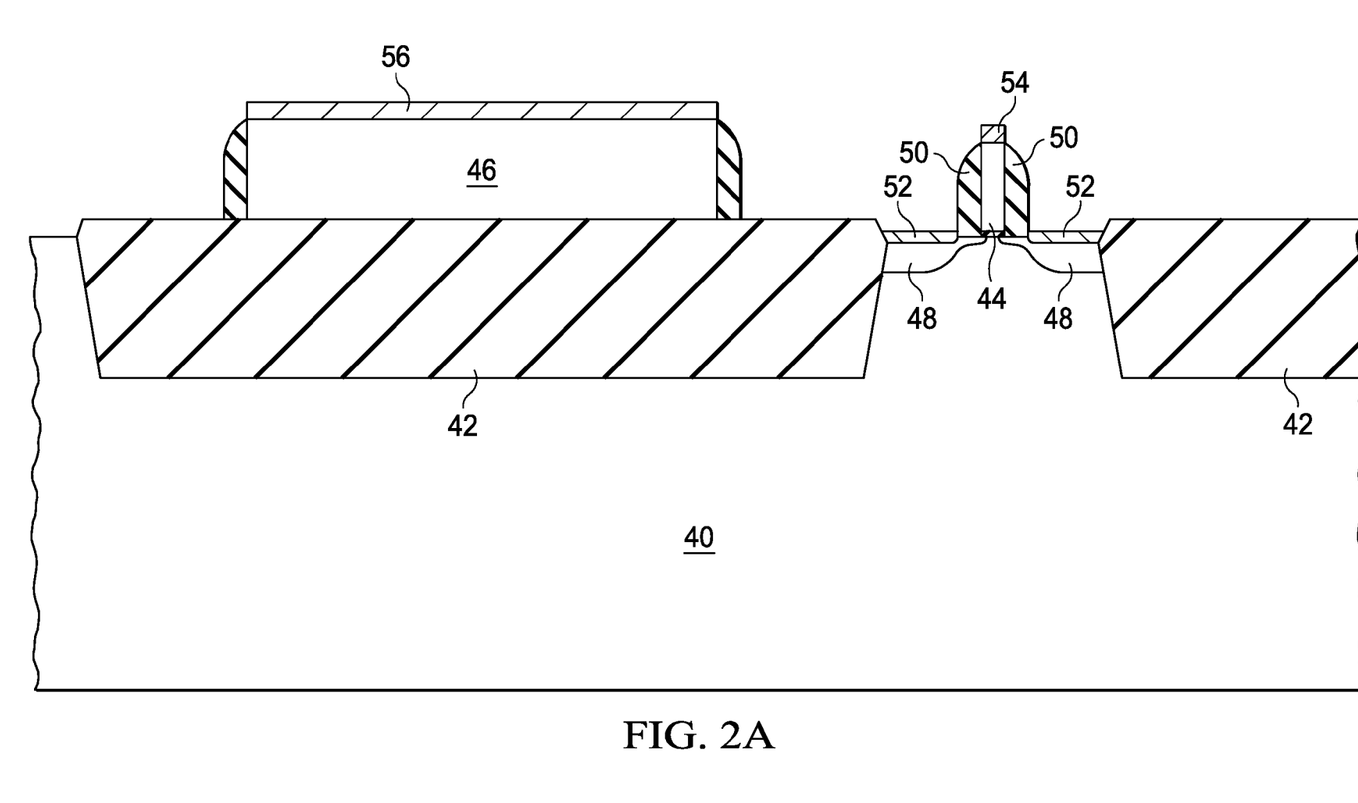
FIGS. 2A-2F are illustrations of steps in the fabrication of integrated circuits formed according to principles of the invention.
Figure 2B:
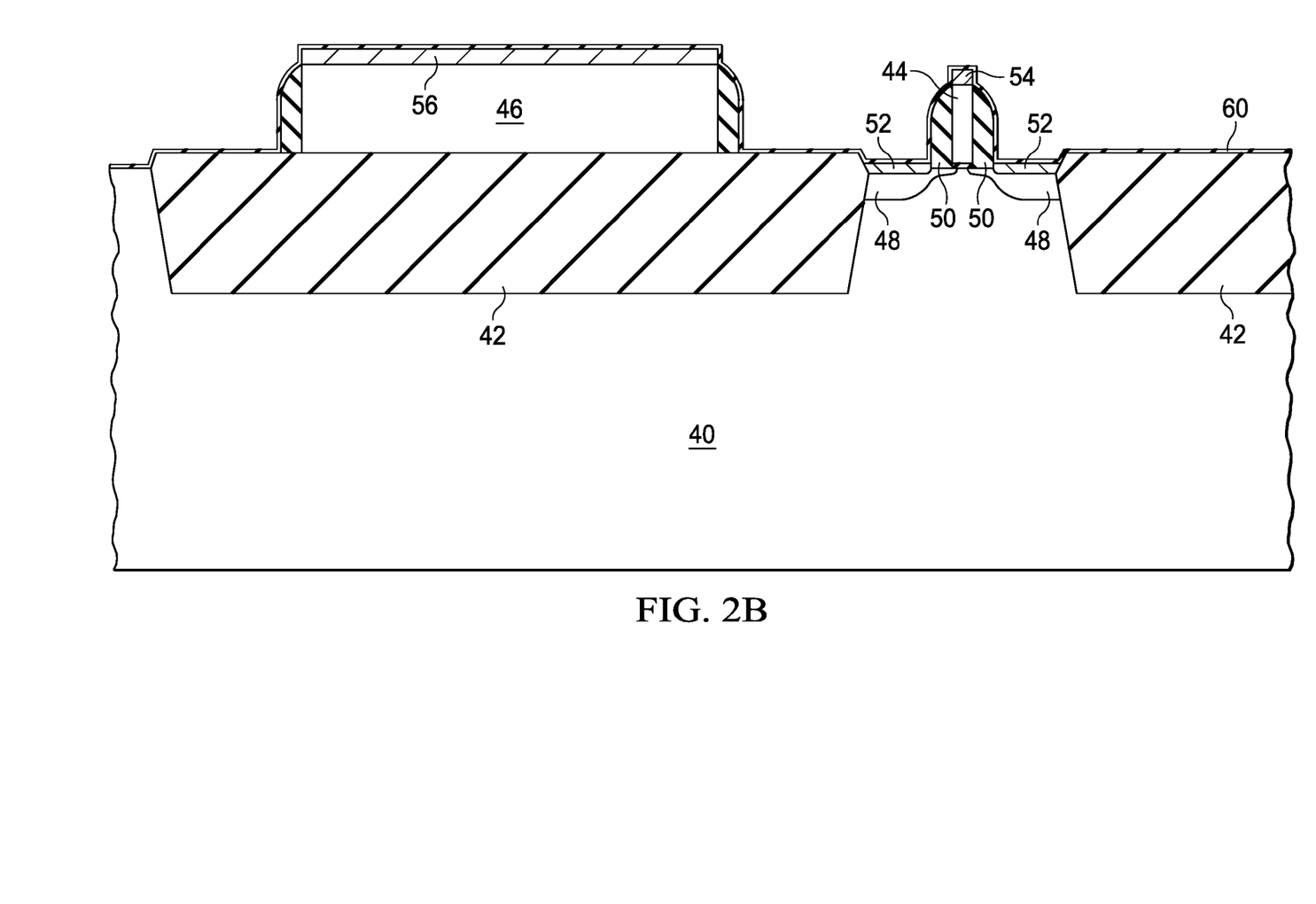
Figure 2C:
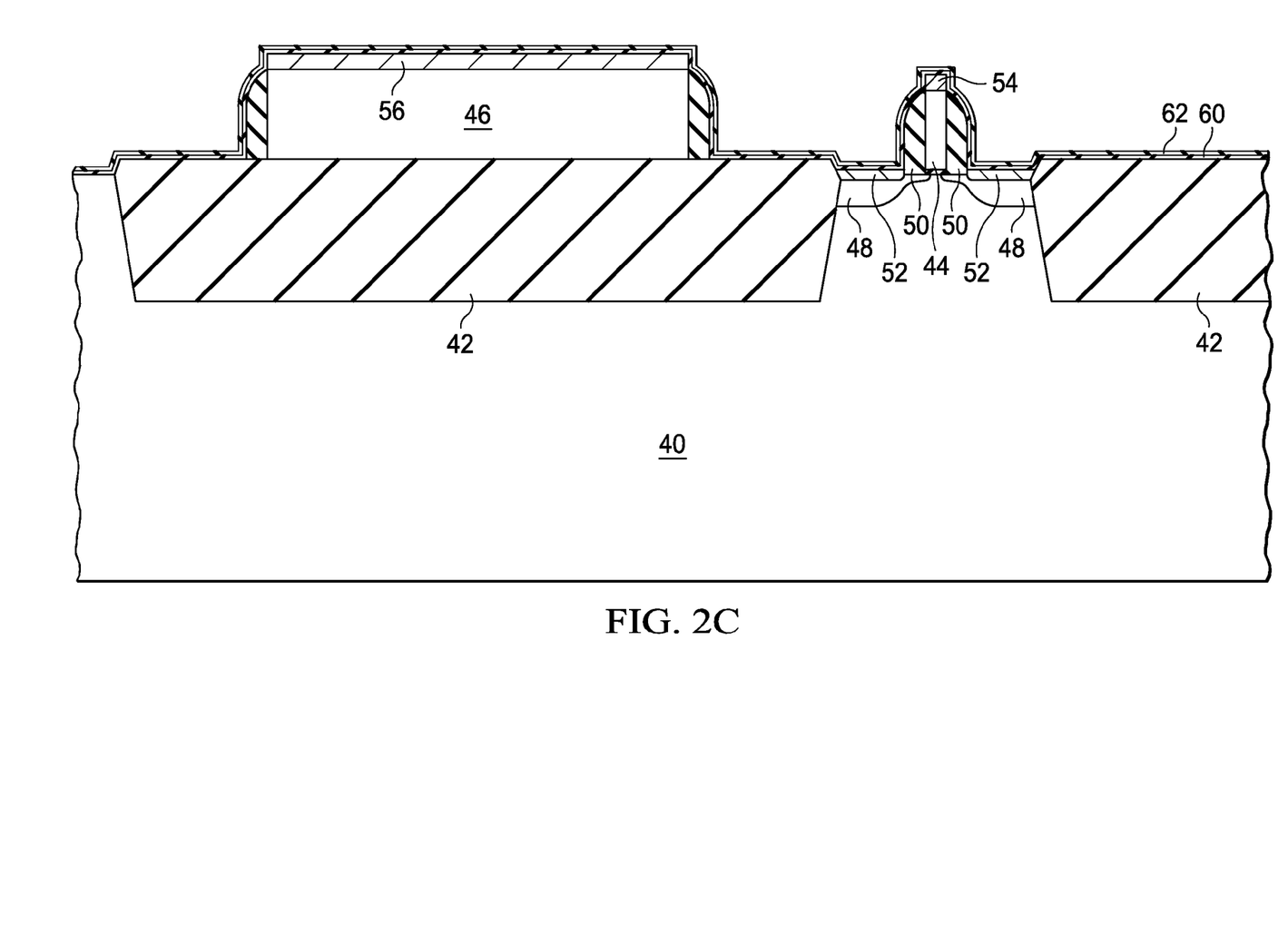

FIGS. 2A through 2C illustrate major steps in a process flow for forming a high precision capacitor on silicided polysilicon according to embodiments.

A cross section of a partially processed integrated circuit is shown in FIG. 2A. Shallow trench isolation (STI) dielectric 42 electrically isolates devices such as the capacitor bottom plate, 46, from the substrate 40 and electrically isolates devices such as transistors which are formed in the substrate 40 from each other. Polysilicon is deposited, patterned, and etched to form transistor gates 44 and also to form the bottom plate of the capacitor 46. The capacitor bottom plate polysilicon 46 may be doped at the same time as the transistor gate 44 is doped either with a pre-gate etch implantation or with the implants used to form the source and drain diffusions 48 of the transistor. Sidewall spacers 50 are formed on the vertical sides of the transistor gate 44. Source and drain diffusions 48 are implanted self-aligned to the sidewall spacers 50. Silicide 56 may be formed on top of the capacitor bottom plate 46 at the same time silicide 52 is formed on the source and drain diffusions 48 and on top of the transistor gate 44.

In an example embodiment illustrated in FIG. 2B the electrode pretreatment may be performed at a temperature range of between about 350° C. to 450° C., for a time in the range of about 5 to 30 sec, HFRF power in a range of about 250 watts to 800 watts, and a pressure in the range of about 1.5 Torr to about 2.5 Torr.

For the embodiment capacitor D in Table 1, the bottom nitride capacitor dielectric layer is about 10 nm thick deposited using PECVD. Deposition conditions are a temperature of about 400° C., HFRF of about 398 watts, reactant gasses of $NH_3$+silane $(SiH_4)$+$N_2$ at a pressure of about 1.8 Torr for about 7.26 seconds.

Embodiment insitu pre and post deposition plasma treatments may be performed to improve the electrical quality of the silicon nitride dielectric. These embodiment plasma treatments may be performed either before the deposition of the nitride layer, after the deposition of the nitride layer or both before and after the deposition of the nitride layer. In an example embodiment a capacitor bottom plate plasma treatment is performed insitu using the PECVD silicon nitride deposition recipe with the silane turned off. The pre-deposition plasma treatment is performed for 0.3 to 30 sec plasma in the $NH_3$+$N_2$ ambient. The silane flow is then turned on and the silicon nitride dielectric is deposited. A post silicon nitride deposition plasma treatment is performed insitu in the PECVD nitride deposition chamber by turning off the silane flow and allowing the plasma to continue for a time in the range of about 0.3 to 30 seconds in an $NH_3$+$N_2$ ambient. In an example embodiment, the bottom capacitor plate 56 plasma treatment, the first silicon nitride layer 60 deposition, and the post silicon nitride layer 60 deposition plasma treatment are all performed sequentially insitu in the same chamber.

In FIG. 2C a silicon dioxide layer 62 is deposited on the silicon nitride layer 60. The silicon dioxide deposition may be performed in a temperature range of between about 350° C. to 450° C. for about 1 to 30 sec in a high frequency power (HFRF) between about 100 watts and 1000 watts, and a pressure in the range of about 0.5 Torr to 3.0 Torr in a $N_2O$+ $SiH_4$+$N_2$ ambient.

Pre and post silicon dioxide deposition plasma treatments may be performed by turning off the silane gas for 1 to 30 sec. The pre silicon dioxide deposition plasma treatment is performed insitu in the plasma enhanced chemical vapor deposition (PECVD) chamber using the PECVD silicon dioxide deposition recipe with the silane turned off. After 1 sec to 30 sec the silane is turned on and the silicon dioxide layer is deposited. After the silicon dioxide layer is deposited, the silane is turned off and the PECVD process is allowed to continue for 1 sec to 30 seconds to accomplish the post silicon dioxide deposition plasma treatment.

For the capacitor dielectric in high precision capacitor D in Table 1, a thickness of about 10 nm silicon dioxide is deposited. The PECVD silicon dioxide is deposited at a temperature of about 400° C., at a pressure of about 2.4 Torr, using HFRF of about 700 watts, with reactant gases nitrous oxide ($N_2O$) and $SiH_4$ in $N_2$ carrier gas, for about 3.09 seconds.

The capacitor silicon dioxide deposition may be performed sequentially in the same chamber as the first silicon nitride.

Figure 2D:
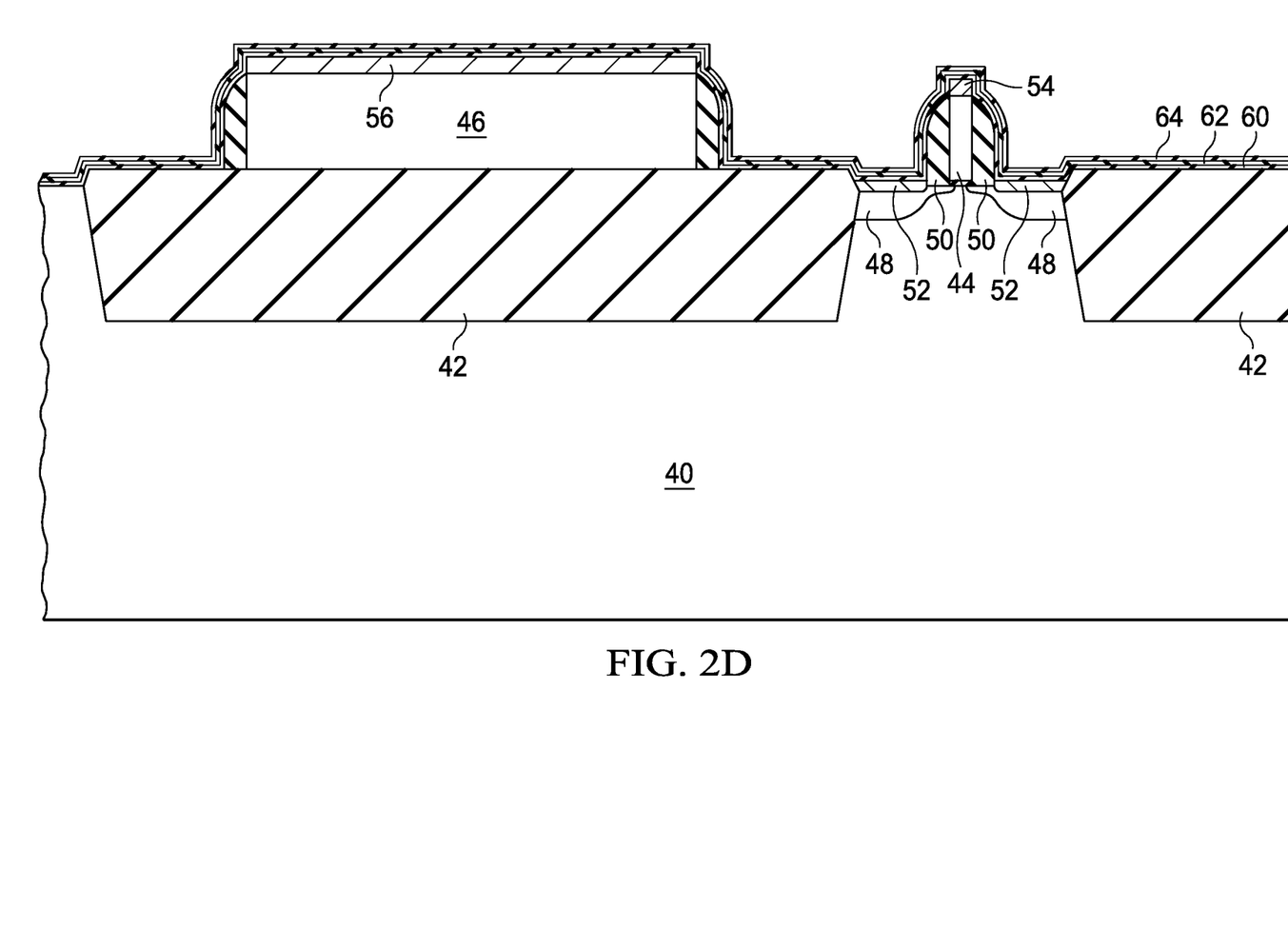

In FIG. 2D a second silicon nitride layer 64 of the composite NON dielectric is deposited according to an embodiment. In an example embodiment the top silicon nitride layer 64 is about 10 nm thick deposited using PECVD. Pretreatment, deposition, and post treatment conditions of the second silicon nitride film 64 in the NON high precision capacitor dielectric are the same as those of silicon nitride layer 60.

The silicon nitride and silicon oxide layers in the NON high precision capacitor dielectric may be additionally improved by depositing each layer in a series of deposition steps that deposit a portion of the dielectric layer. For example a 10 nm nitride layer may be deposited as five separate 2 nm thick layers of silicon nitride with an insitu plasma treatment performed between each layer and after the deposition by turning off the silane flow for 0.3 to 30 sec between each deposition step.

Figure 2E:
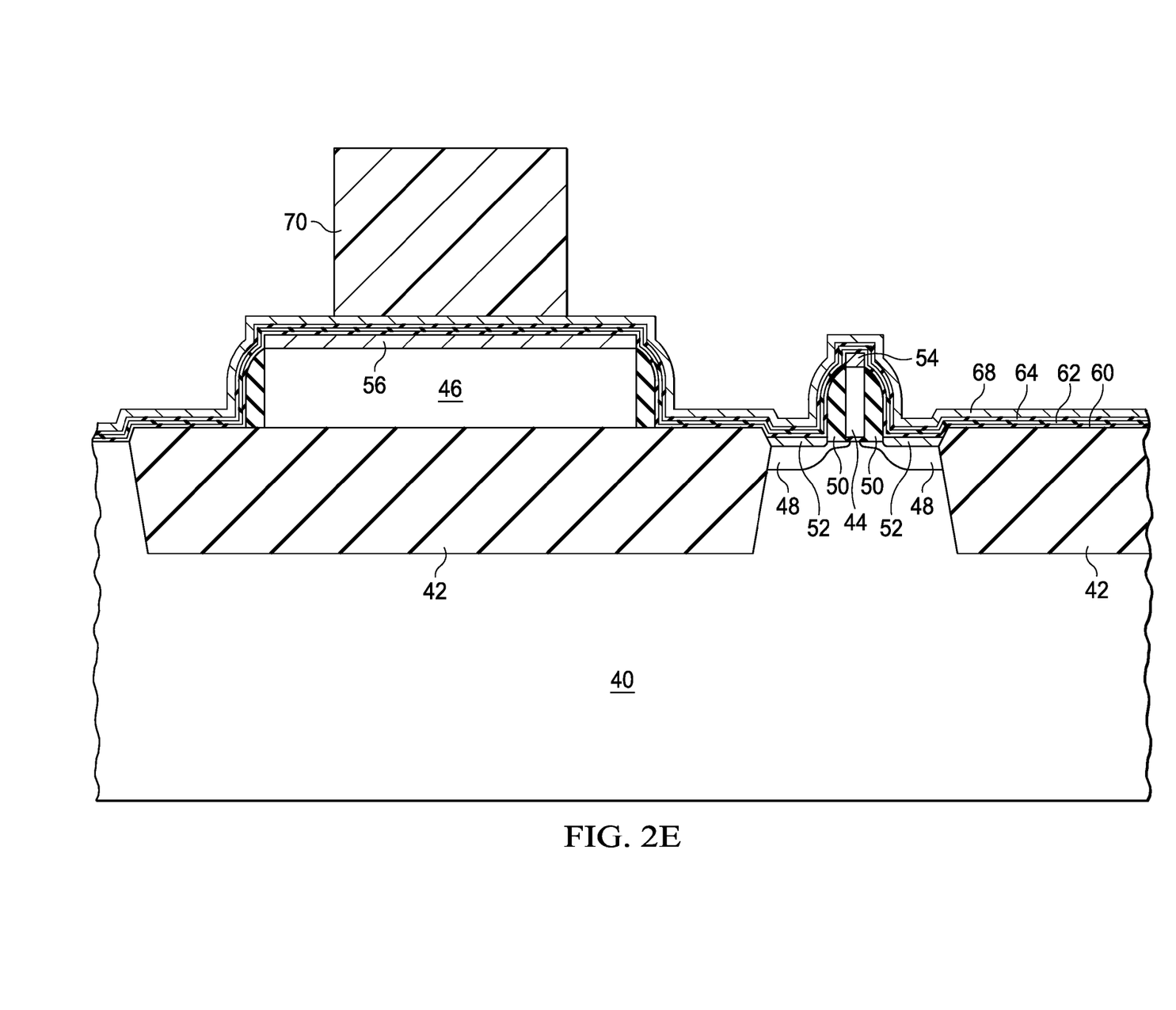

In FIG. 2E a metallic capacitor top plate material 68 such as TaN or TiN is deposited on the composite capacitor dielectric. A capacitor top plate photo resist pattern 70 is then formed on the capacitor top plate material 68. In an example embodiment TaN with a thickness in the range of about 3 to 80 nm is sputter deposited.

Figure 2F:
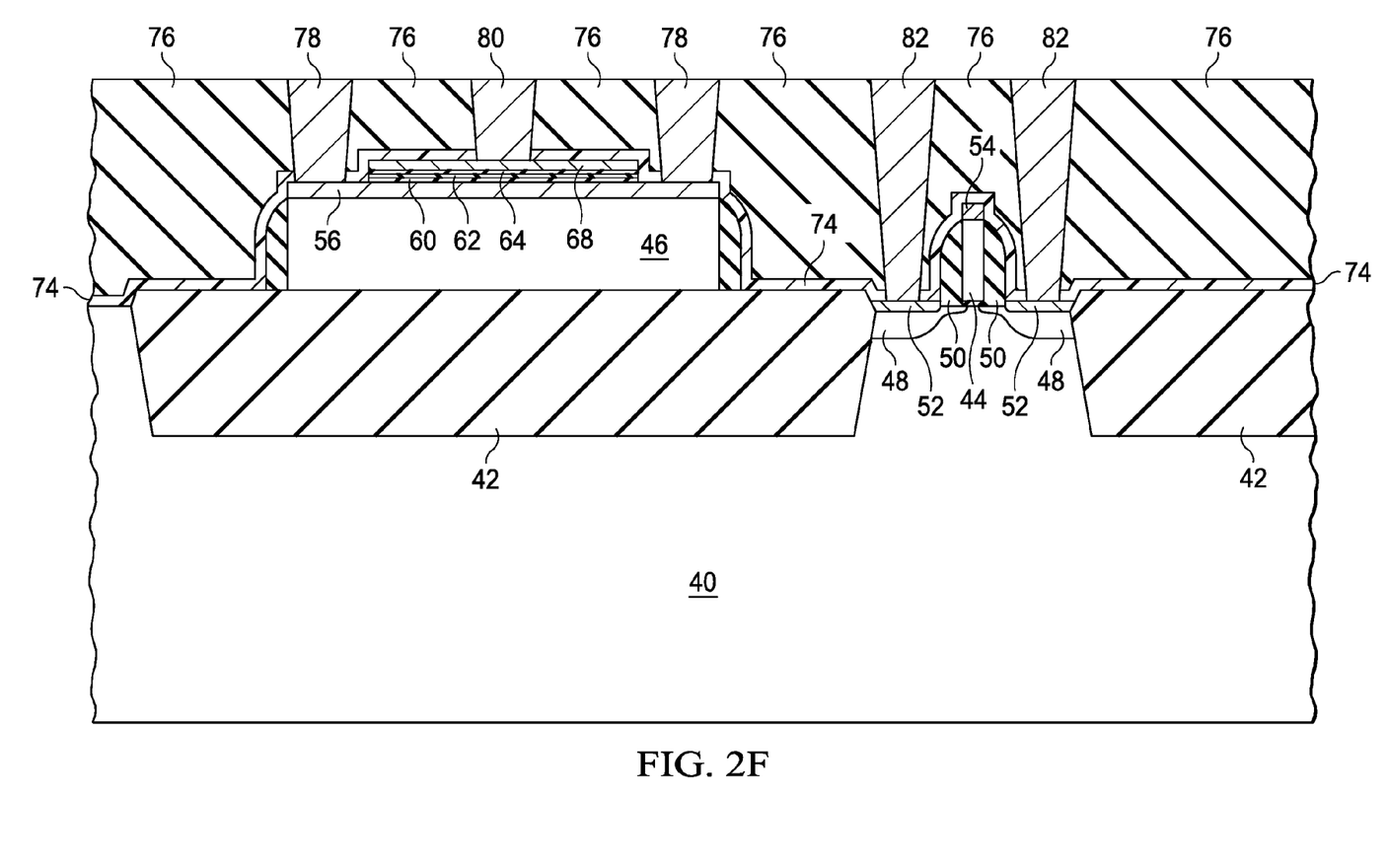

The cross-section in FIG. 2F shows the integrated circuit after the top plate material 68 and the composite dielectric NON capacitor dielectric are etched. An etch stop layer 74 which may be a dual stress liner is deposited after the photo resist pattern 70 is removed. Pre-metal dielectric layer (PMD) 76 is then deposited and contact plugs are formed through the dielectric 76 to make electrical contact to the capacitor bottom plate 78, contact to the capacitor top plate 80 and contact to the source and drain 82 of the transistor. Additional processing steps to form interconnect layers, interlevel dielectrics (IMD), and protective overcoat (PO) layers may be used to complete the integrated circuit.

An embodiment process similar to that described above formed high precision capacitor, D, in Table 1 with an α of about 1.45 ppm/$V^2$. This low α significantly reduces capacitor variation due to voltage and significantly improves the high precision operations in integrated circuits that employ high precision capacitors such as in integrated circuits that employ A2D and D2A converters.

FIGS. 3A through 3E illustrate major steps in a process flow for forming a high precision capacitor within the interconnect layers in an integrated circuit according to embodiments.

Figure 3A:
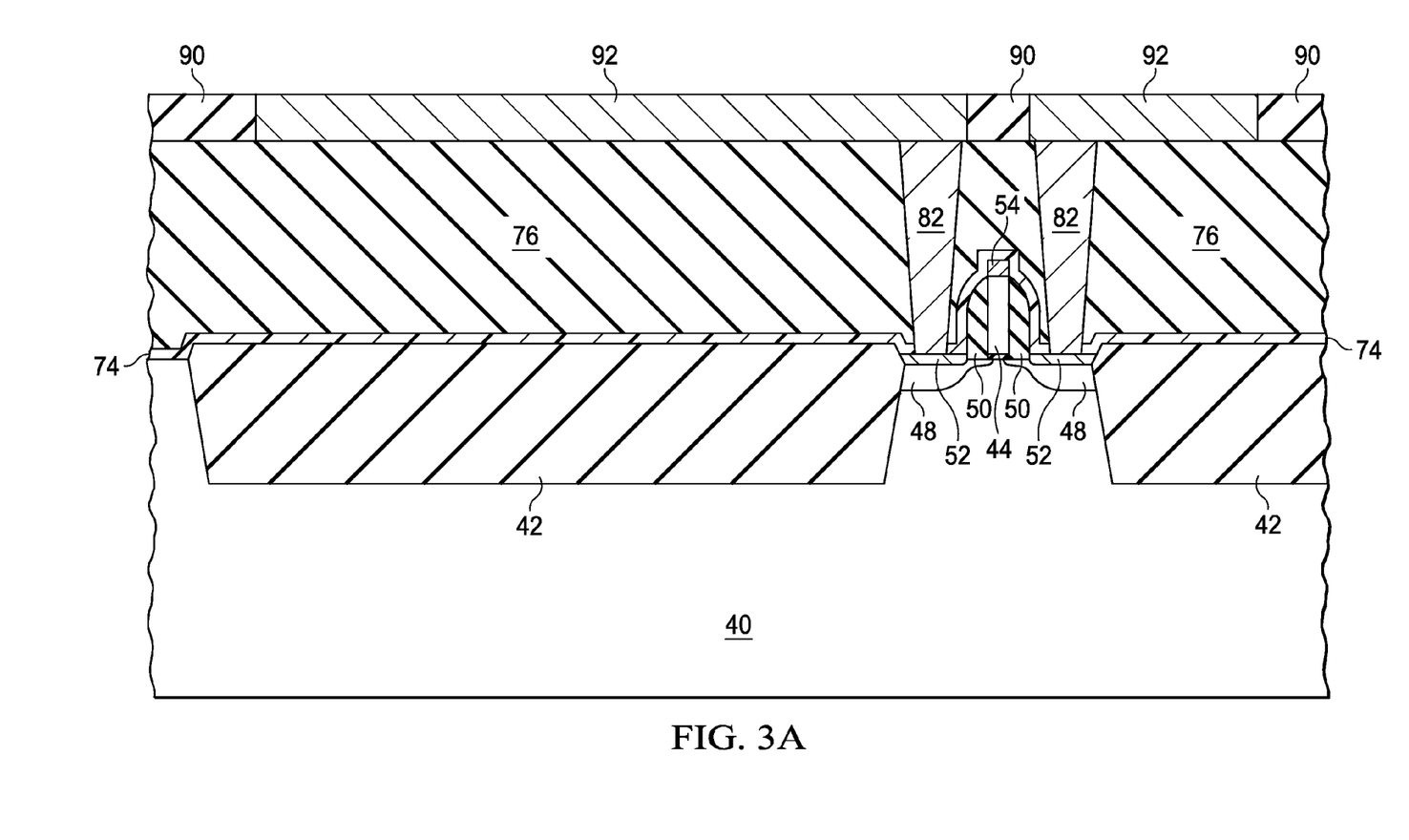
FIGS. 3A-3E are illustrations of steps in the fabrication of integrated circuits formed according to principles of the invention.

FIG. 3A is the cross section of an integrated circuit that is partially processed through a first level of interconnect 92. A first inter metal dielectric (IMD) layer 90 is deposited over the contact plugs 82 and PMD layer 76. PMD layer 76 is formed on etch stop layer 74. A first layer of interconnect 92 is formed in the IMD layer 90. The first layer of interconnect 92 may be sputter deposited aluminum alloy which is then pattern and etched, covered with the IMD layer 90, and planarized with CMP. Alternatively the IMD layer 90 may be deposited first and a photo resist pattern used to form interconnect trenches in the IMD 90 which may then be filled with a metal such as electroplated copper and planarized using CMP. Although this embodiment is illustrated using a first level of interconnect, the embodiment high precision capacitor may be formed above the first layer of interconnect or may be formed above an upper level of interconnect.

Figure 3B:
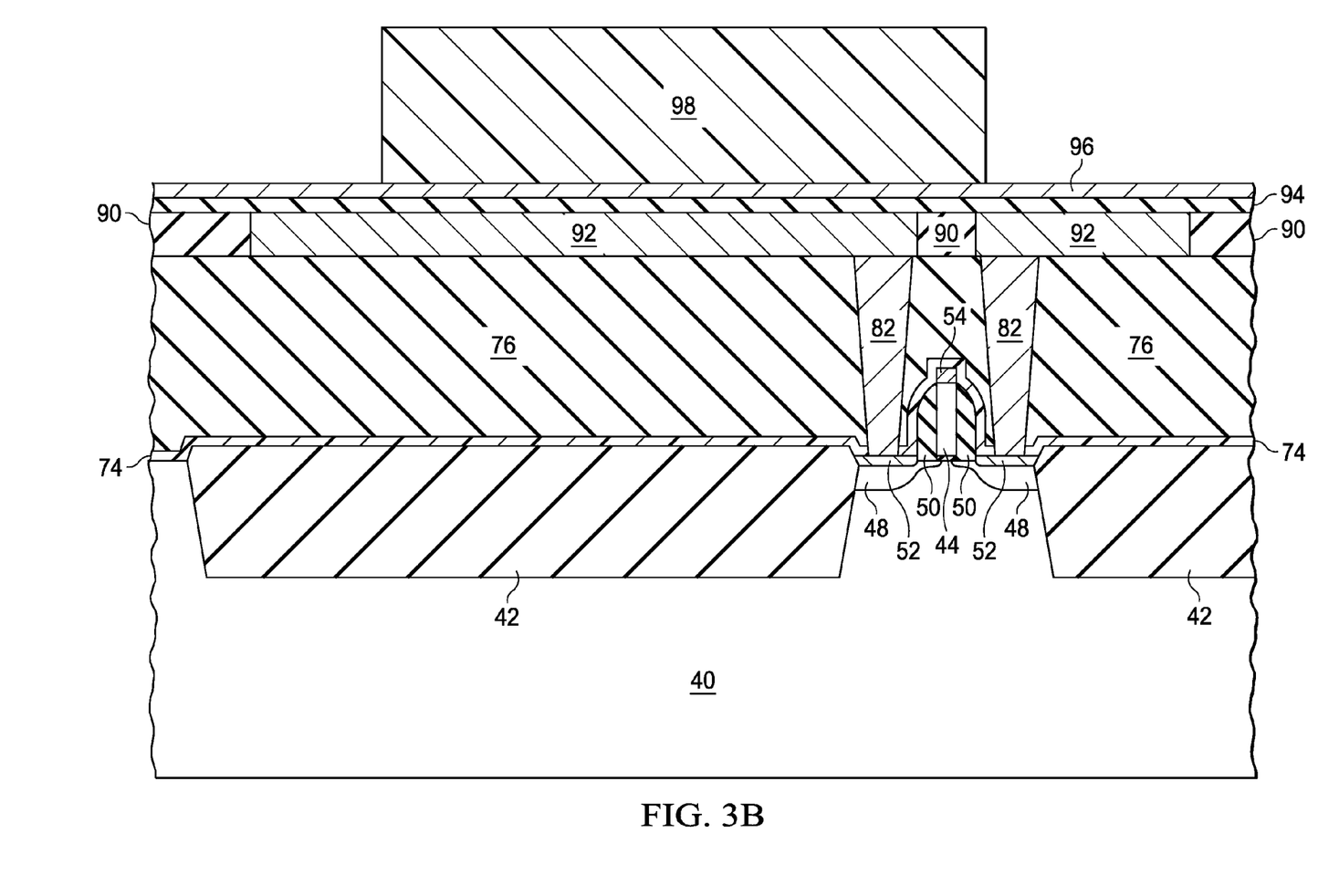

In FIG. 3B a second dielectric layer 94 is deposited over the first interconnect layer 92 and high precision capacitor bottom plate material 96 is deposited over the dielectric layer 94. A capacitor bottom plate photo resist pattern 98 is formed on the capacitor bottom plate material 96. The dielectric layer 94 may be a dielectric such as silicon dioxide or silicon nitride. In an example embodiment about 100 nm of PECVD silicon dioxide is deposited. The high precision capacitor bottom plate material 96 may be a metallic material such as TaN, TiN, or TiW. In an example embodiment about 50 nm TaN is deposited with reactive sputtering. If desired a metallic resistor may be formed simultaneously with formation of the high precision capacitor bottom plate.

Figure 3C:
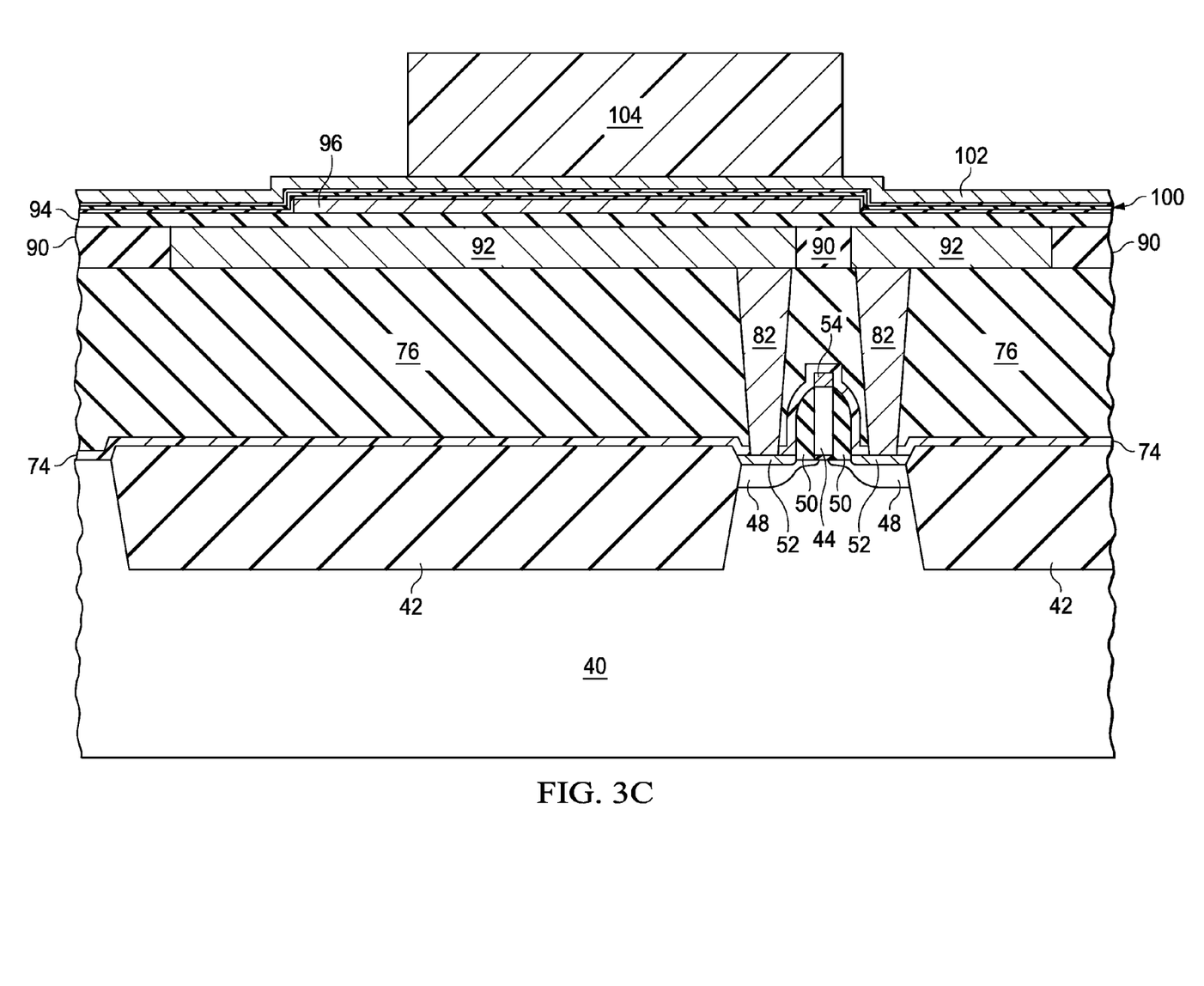

The cross-section in FIG. 3C shows the integrated circuit after the high precision capacitor bottom plate 96 is etched and the capacitor bottom plate photo resist pattern 98 is removed. As described previously, the high precision capacitor bottom plate is then given a plasma treatment in a $NH_3+N_2$ ambient to remove poor quality native oxide which degrades the electrical properties of the high precision capacitor.

An embodiment NON high precision capacitor dielectric 100 may then be deposited using PECVD techniques as described above. The silicon nitride films are deposited using $NH_3+SiH_4$ reactant gasses plus $N_2$ carrier gas. The silicon dioxide film is deposited using $N_2O+SiH_4$ reactant gases plus $N_2$ carrier gas.

Post deposition plasma treatments of the silicon nitride films may be performed in an $NH_3+N_2$ ambient by turning off the silane reactant gas and allowing the plasma to continue. Insitu post deposition plasma treatment of the silicon dioxide film may be performed in an $N_2O+N_2$ ambient by turning off the silane reactant gas and allowing the plasma to continue.

A high precision capacitor top plate metallic material 102 such as TaN, TiN, or TiW is deposited using well known techniques such as sputter deposition and a capacitor top plate photo resist pattern 104 is formed there on.

Figure 3D:
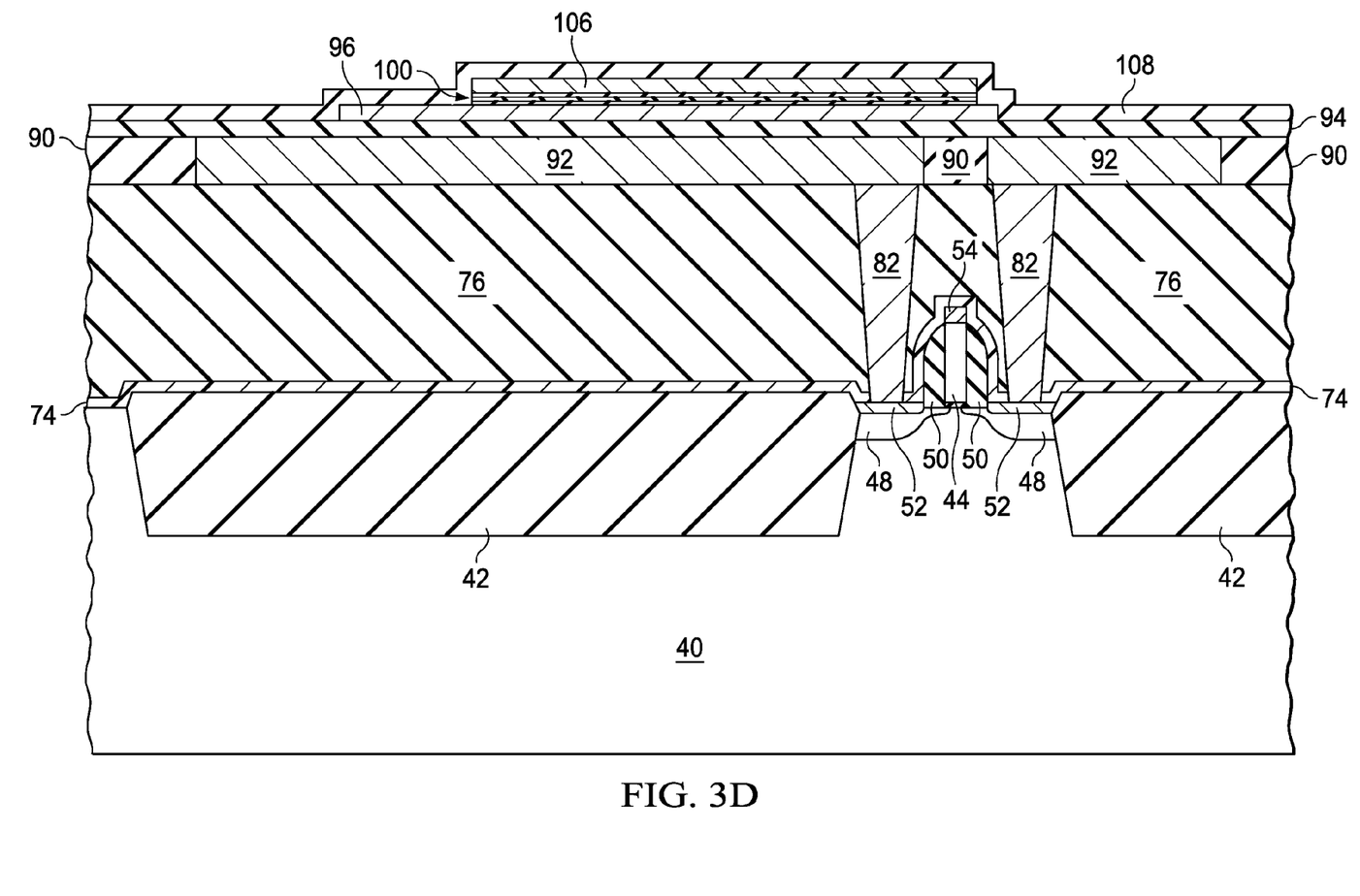

As shown in FIG. 3D, after the high precision capacitor top plate material 102 is etched to form the high precision capacitor top plate 106 and high precision capacitor dielectric 100 are etched, an etch stop layer 108 may be deposited over the integrated circuit. The etch stop layer 108 may be a dielectric such as silicon nitride, silicon carbide, or aluminum oxide. In an example embodiment etch stop layer 108 is 50 nm of silicon nitride.

Figure 3E:
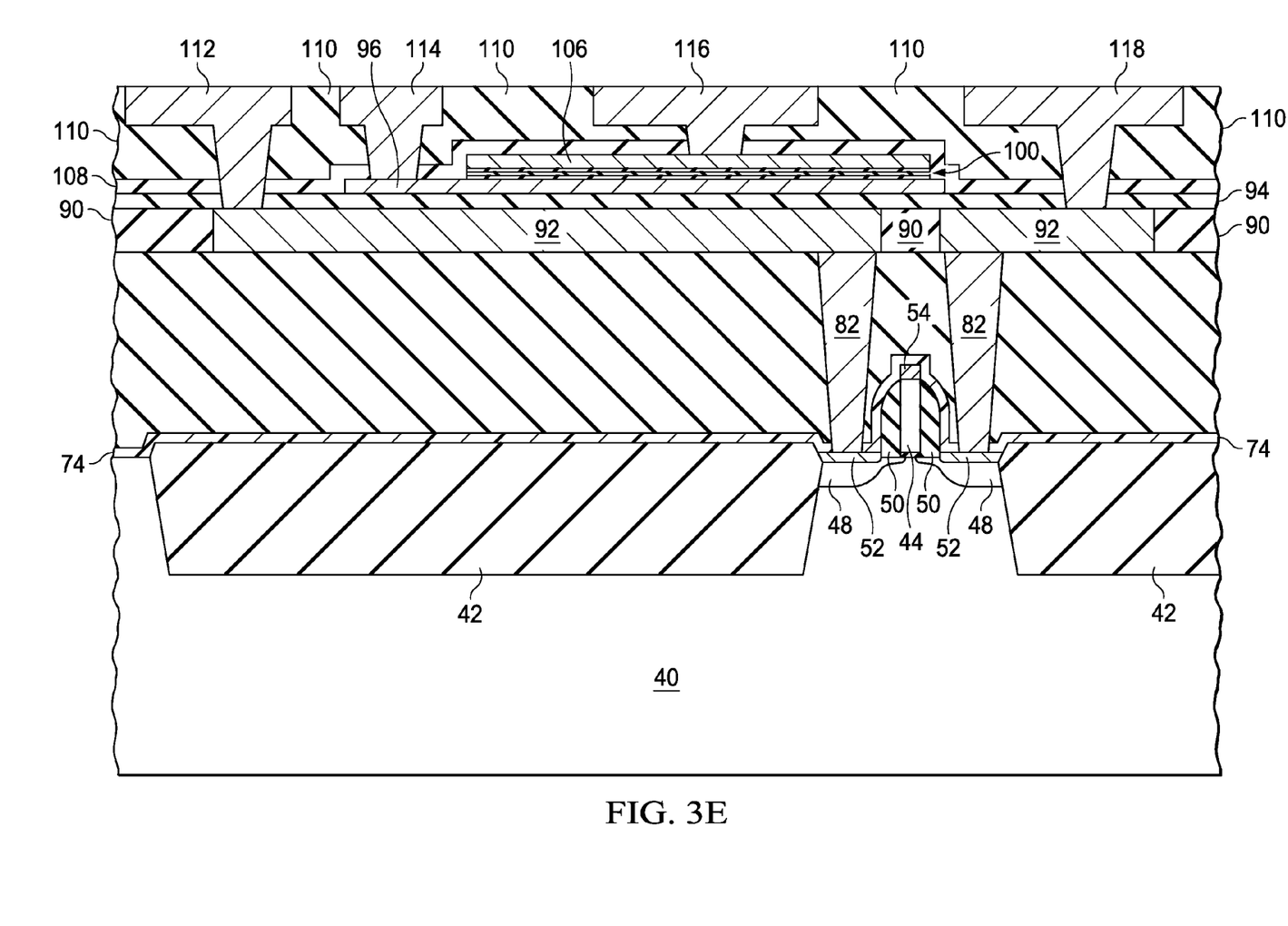

As shown in FIG. 3E, IMD dielectric 110 may then be deposited and planarized and vias and a second level of interconnect may be formed in the IMD 110 to make electrical connection 114 to the high precision capacitor bottom plate 96, electrical connection 116 to the high precision capacitor top plate 106, and electrical connections 112 and 118 to the first level of interconnect 92. IMD layer 110 may be a dielectric such as PECVD silicon dioxide or a low-K dielectric material.

Additional levels of dielectric and interconnect may be added to complete the integrated circuit. As mentioned before the embodiment method may be used to form a high precision capacitor below the first level of interconnect or above any of the levels of interconnect in the integrated circuit.

In the illustrative embodiment, a layer of dielectric 94 is formed between the interconnect below the capacitor and the bottom plate of the high precision capacitor, but the bottom plate of the capacitor may be formed directly on the lower level of interconnect if desired.

Similarly levels of dielectric 108 and 110 are formed between the high precision capacitor top plate and the upper level of interconnect, but the top plate of the high precision capacitor may be formed with the upper level of interconnect if desired.

The inventive plasma pretreatment of the capacitor bottom plate prior to the capacitor dielectric deposition and the inventive plasma insitu treatments of the composite capacitor dielectric films pre and post deposition may be used in a variety of high precision capacitor configurations.

Those skilled in the art to which this invention relates will appreciate that many other embodiments and variations are possible within the scope of the claimed invention.

What is claimed is:

1. A process of forming an integrated circuit, comprising the steps:
   providing a partially processed integrated circuit;
   forming a high precision capacitor bottom plate with a metallic surface on the partially processed integrated circuit;
   performing a plasma treatment of the metallic surface in a nitrogen plus ammonia ambient;
   forming a high precision capacitor dielectric by:
      depositing a first layer of a high precision capacitor dielectric on the high precision capacitor bottom plate wherein the first layer is silicon nitride;
      depositing a second layer of the high precision capacitor dielectric on the first layer wherein the second portion is silicon dioxide; and
      depositing a third layer of the high precision capacitor dielectric on the second portion wherein the third layer is silicon nitride; and
   forming a metallic high precision capacitor top plate on the high precision capacitor dielectric.

2. The process of claim 1, wherein the plasma treatment step is performed at a temperature between 350° C. to 450° C., a high frequency RF power between 250 watts and 800 watts, a pressure between about 1.5 Torr and 2.5 Torr, and a time between 5 and 30 sec.

3. The process of claim 1, wherein the step of forming the high precision capacitor dielectric further comprises the steps:
   performing an insitu pre deposition and an insitu post deposition plasma treatment of the first layer and of the third layer for 0.3 to 30 sec using a PECVD deposition recipe for the silicon nitride with silane turned off; and
   performing an insitu pre and post deposition plasma treatment of the second layer for 5 to 30 sec using a PECVD deposition recipe for the silicon dioxide with silane turned off.

4. The process of claim 1, wherein a PECVD deposition recipe for the silicon nitride are temperature between 350° C. and 450° C., high frequency power between 150 watts and 800 watts, pressure between 0.5 Torr and 2.5 Torr, and time between 3 and 30 sec and wherein PECVD deposition conditions for the silicon dioxide are temperature between 350° C. and 450° C., high frequency RF power between 100 watts and 1000 watts, pressure between 0.5 Torr and 3.0 Torr, and time between 1 and 30 sec.

5. The process of claim 1, wherein the silicon nitride for the first layer and the third layer has a thickness of 10 nm, wherein a PECVD deposition recipe for the first layer and the third layer are temperature at 400° C., high frequency power of 400 watts, pressure of 1.8 Torr, and time 7.25 seconds, wherein the silicon dioxide for the second layer has a thickness of 10 nm, and wherein the deposition conditions for the second layer are temperature at 400° C., high frequency power of 700 watts, pressure of 2.4 Torr, and time 3.10 seconds.

6. The process of claim 1, wherein the first layer, the second layer, and the third layer are 10 nm thick.

7. The process of claim 1, wherein the step of depositing the first layer and the third layer further comprise the steps:
performing a pre deposition plasma treatment for 0.3 to 30 sec using PECVD silicon nitride deposition recipe with silane turned off;
depositing the first layer as a series of two or more deposition steps using PECVD silicon nitride deposition recipe with an insitu plasma treatment for 0.3 to 30 sec between each deposition step using the PECVD silicon nitride deposition recipe with the silane turned off; and
performing an insitu post deposition plasma treatment for 0.3 to 30 sec using PECVD silicon nitride deposition recipe with silane turned off.

8. The process of claim 1, wherein the step of forming the high precision capacitor bottom plate further comprises:
depositing a polysilicon layer;
forming a photo resist pattern on the polysilicon layer;
etching the polysilicon layer to form a gate of a transistor in the integrated circuit and to form the high precision capacitor bottom plate; and
forming a silicide on the gate and on the high precision capacitor bottom plate.

9. The process of claim 8, wherein the silicide is titanium silicide, cobalt silicide, or nickel silicide.

10. A process of forming an integrated circuit, comprising the steps:
providing a partially processed integrated circuit;
depositing a polysilicon layer on the partially processed integrated circuit;
forming a transistor gate photo resist pattern on the polysilicon layer wherein the transistor gate photo resist pattern contains a high precision capacitor bottom plate photo resist pattern;
etching the polysilicon layer to form transistor gates in the integrated circuit and to form a high precision capacitor bottom plate;
forming a silicide surface on the high precision capacitor bottom plate and on the transistor gates;
pre-cleaning the silicide surface of the high precision capacitor bottom plate in a nitrogen plus ammonia plasma at a temperature in the range of about 350° C. to 450° C., a high frequency power in the range of about 250 watts to 800 watts, a pressure in the range of about 1.5 Torr to 2.5 Torr, and for a time in the range of about 5 seconds to 30 seconds;
depositing a first layer of a high precision capacitor dielectric on the high precision capacitor bottom plate wherein the first layer is silicon nitride;
depositing a second layer of the high precision capacitor dielectric on the first layer wherein the second portion is silicon dioxide;
depositing a third layer of the high precision capacitor dielectric on the second portion wherein the third layer is silicon nitride; and
depositing a metallic layer on top of the third layer;
forming a high precision capacitor top plate photo resist pattern on the metallic layer; and
etching the metallic layer to form a high precision capacitor top plate.

11. The process of claim 10, wherein the silicide is titanium silicide, cobalt silicide, or nickel silicide.

12. The process of claim 10, wherein the step of depositing the first layer comprises:
depositing the first silicon nitride film using a silicon nitride PECVD deposition recipe with ammonia and silane reactant gases and nitrogen carrier gas at a temperature of 400° C., a high frequency power of 320 watts, and a pressure of 1.8 Torr; and
performing an insitu post first silicon nitride deposition plasma treatment for 0.3 sec to 30 sec. using the silicon nitride PECVD deposition recipe with the silane reactant gas turned off;
wherein the step of depositing the second layer comprises:
performing an insitu pre silicon dioxide deposition plasma treatment for 1 to 30 seconds using a silicon dioxide PECVD deposition recipe with a silane reactant gas turned off;
depositing silicon dioxide using the silicon dioxide PECVD recipe which is nitrous oxide and silane reactant gases and nitrogen carrier gas at a temperature of about 400° C., a high frequency power of about 200 watts, and a pressure of about 1.0 Torr on top of the first silicon nitride film; and
performing an insitu post silicon dioxide deposition plasma treatment for 1 to 30 seconds using the silicon dioxide PECVD deposition recipe with the silane reactant gas turned off;
and wherein the step of depositing the third layer comprises:
performing an insitu pre second silicon nitride deposition plasma treatment for 0.3 to 30 sec using the silicon nitride PECVD deposition recipe with the silane reactant gas turned off;
depositing a second silicon nitride film using the silicon nitride PECVD deposition recipe; and
performing an insitu post second silicon nitride deposition plasma treatment for 0.3 to 30 sec using the silicon nitride PECVD deposition recipe with the silane reactant gas turned off.

13. The process of claim 10, wherein the metallic layer is TaN, TiN, or TiW.

* * * * *